INVENTOR
N. TAKAHASHI
BY Glascock, Downing & Seebold
ATTORNEYS

INVENTOR
N. TAKAHASHI
BY Glascock, Downing & Seebold
ATTORNEYS

INVENTOR
N. TAKAHASHI
BY Glascock, Downing + Seebold
ATTORNEYS

INVENTOR

N. TAKAHASHI

BY Glascock, Downing & Seebold

ATTORNEYS 3,566,294

SOUND EFFECT AMPLIFIER

Nobuaki Takahashi, 1594–3 Fukuda, Kanagawa-ken, Yamato, Japan

Filed Oct. 18, 1968, Ser. No. 768,745
Claims priority, application Japan, Oct. 18, 1967, 42/87,812
Int. Cl. H03f 1/34
U.S. Cl. 330—28 7 Claims

ABSTRACT OF THE DISCLOSURE

A sound effect amplifier comprising an amplifier circuit, a plurality of series resonance circuits connected in parallel relation to one another and forming together with said amplifier circuit a device for dividing an input signal into respective frequency bands and for amplifying or attenuating the respective frequency bands, and a damping resistance disposed in series in each of said series resonance circuits whereby increase or decrease of the gain is carried out separately for each of the frequency bands or simultaneously for all of them.

Figure 1:
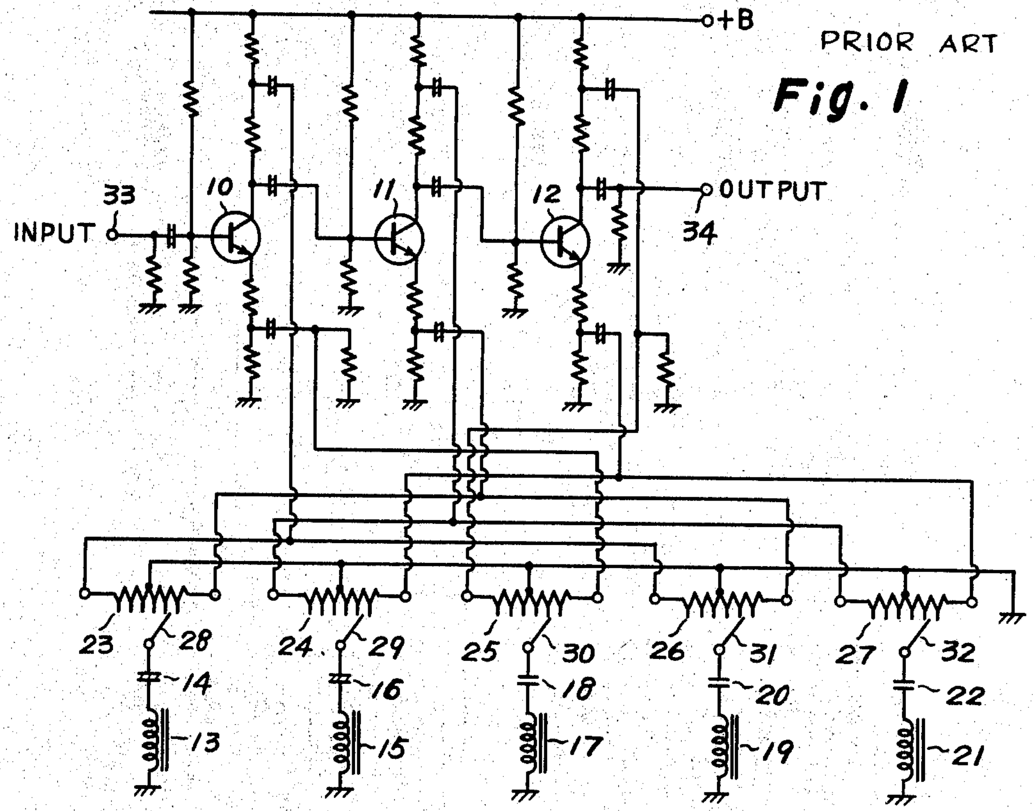

This invention relates to a sound effect amplifier and, particularly to a sound effect amplifier utilizing a frequency band divisional amplification-attenuation device usable with a stereophonic reproducing apparatus.

In general, even if a sound from a sound source of a reproducing apparatus has a flat frequency characteristic, the sound at a listener's position is to have its distorted frequency characteristic represented by a curve including tops and valleys because of the fact that respective portions of a room have varied sound field distributions due to echo etc. Also, when a microphone is used, for example, in a council chamber, if the volume is increased, there occurs a howling phenomenon.

In such situation, if an action is repeatedly taken to reduce the gain of the howling frequency and to correspondingly increase the general volume, then the volume may be increased to twice the initial volume without accompanying a howling. The sound field level at this time has a plane frequency characteristic and the articulation is improved twice as much. When listening to a stereophonic reproducing unit playing a music, in a room, it is similarly necessary to carry out gain control in accordance with the sound field within the room.

Moreover, in recording process for the manufacture of record discs, a plurality of microphones are used for taking up sounds of respective playing musical instruments, and the sounds thus taken up are subjected to mixing by the sense of a mixer and then are formed into a combined sound by the side of the manufacturer. On the sides of listeners, there are cases wherein needs occur to control volume components in respect of respective musical instrument sounds in accordance with individual listener's preference. There also occurs a need to vary sounds in accordance with kinds of musics and also with one's fondness.

A primary object of the present invention is to provide a sound effect amplifier which satisfies the above-mentioned requirements and provides a sound effect to make sound appropriate for the field in which a reproducing apparatus concerned is located and for the preference of the listener.

Another object of the present invention is to provide a sound effect amplifier which is obtainable by use of frequency band divisional amplification-attenuation device operable to divide a sound to be reproduced into respective frequency bands and to amplify or attenuate them respectively.

A further object of the present invention is to provide a sound effect amplifier which does not utilize a plurality of damping amplifiers but a single amplifier to carry out control of a plurality of frequency bands.

A still further object of the present invention is to provide a sound effect amplifier which is effective to reduce parallel resonance phenomenon and which has reduced distortion and increased stability.

Figures 2, 13:
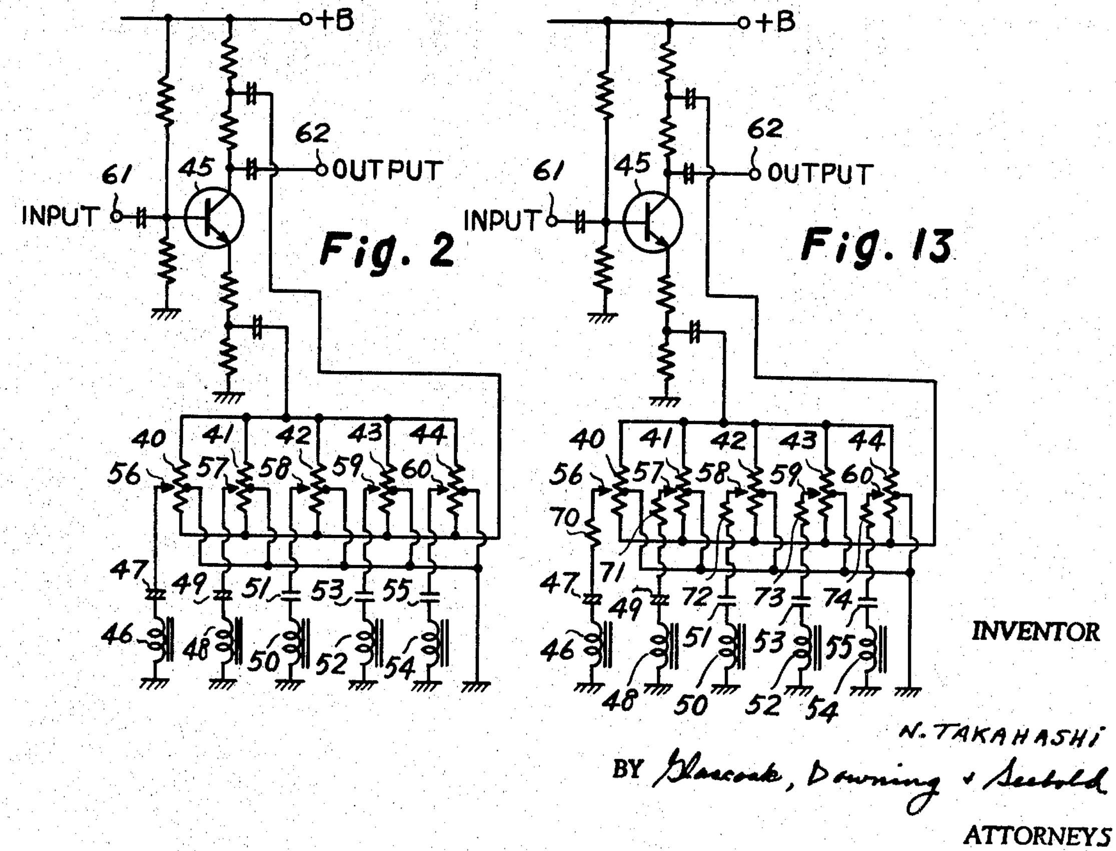
Figure 3:
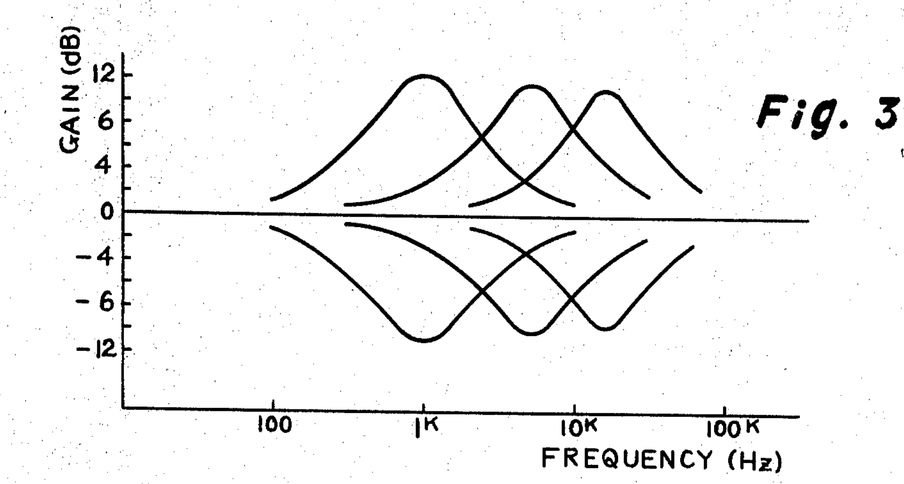
Figure 4:
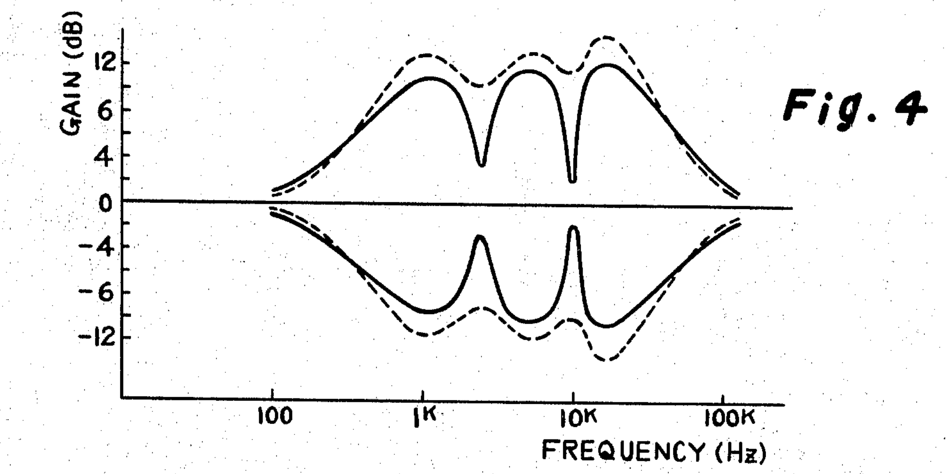
Figure 6:
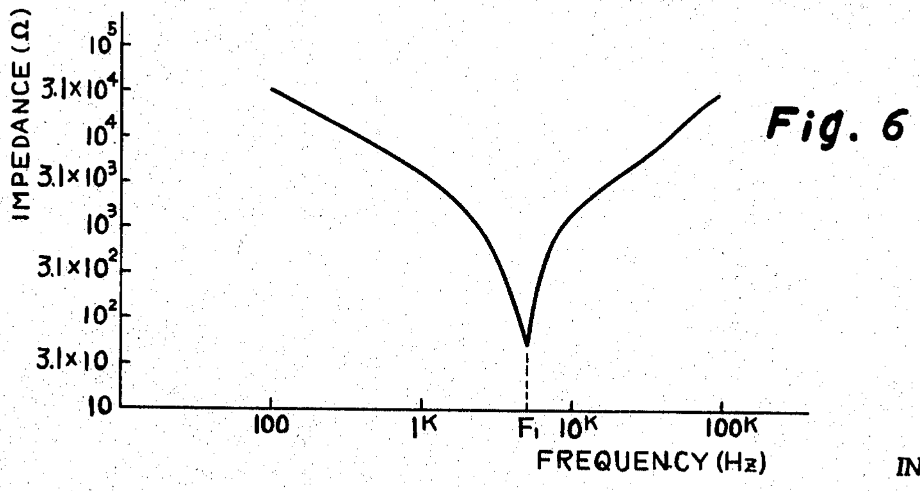
Figure 5:
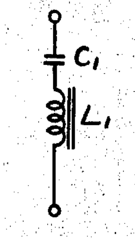
Figure 7:
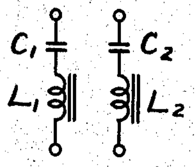
Figure 9:
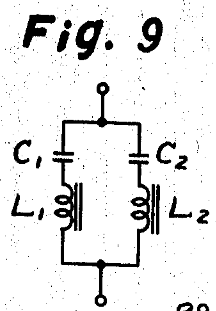
Figure 11:
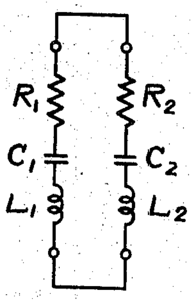
Figure 14:
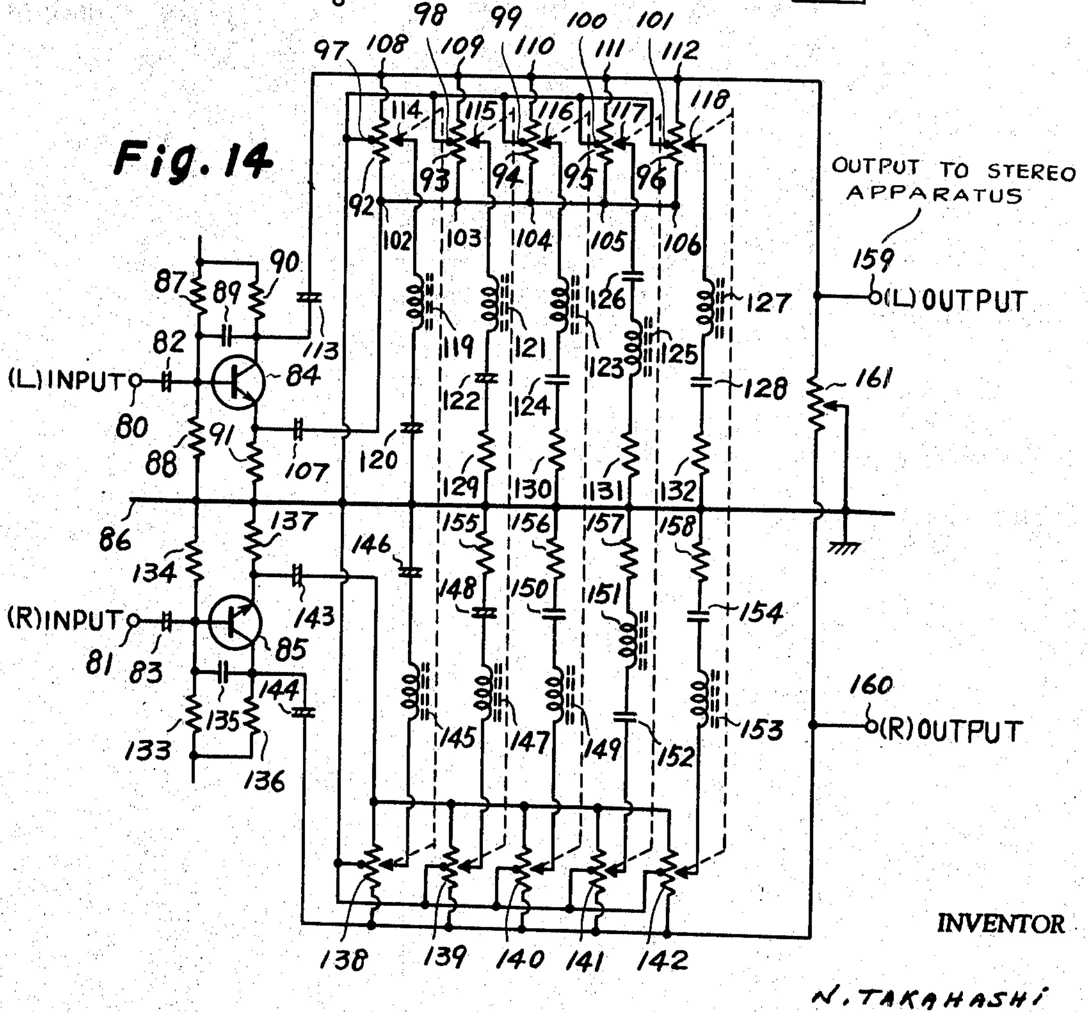
Figure 8:
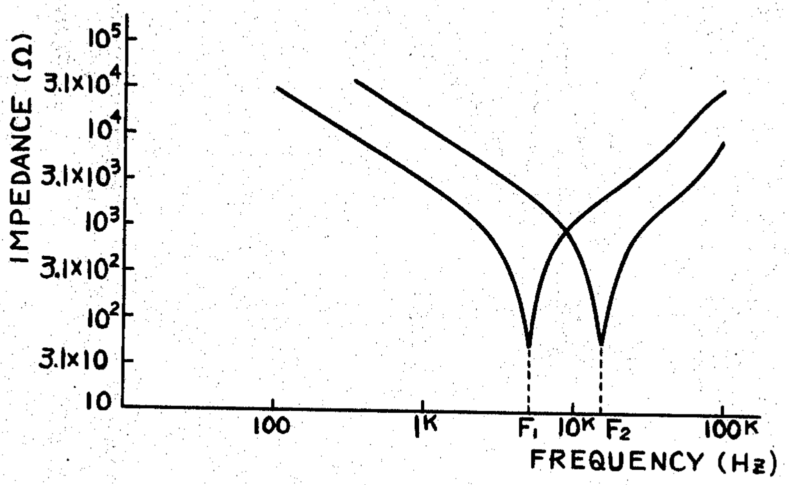
Figure 10:
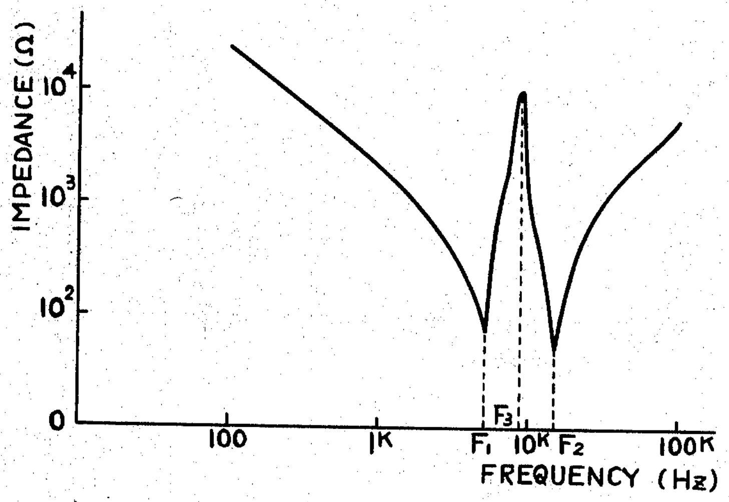
Figure 12:
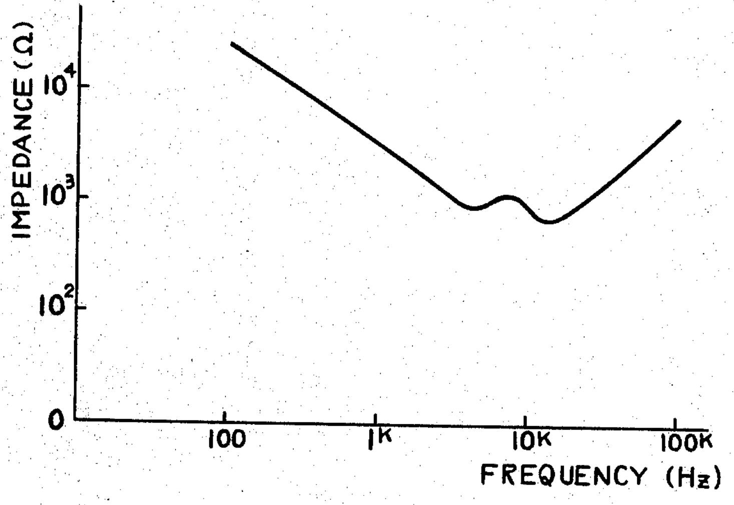

Other objects and features of the present invention will become apparent from the description to be made hereinafter in conjunction with the accompanying drawings in which:

FIG. 1 is a circuit diagram of a conventional sound effect amplifier,

FIG. 2 is a circuit diagram showing an example of improvements in the conventional sound effect amplifier shown in FIG. 1, FIGS. 3 and 4 diagrammatically illustrate the frequency characteristics of the circuit shown in FIG. 2, respectively, FIGS. 5 and 6 diagrammatically illustrate an L-C series resonance circuit and its impedance-frequency characteristic, respectively, FIGS. 7 and 8 diagrammatically illustrate two series resonance circuits and their impedance-frequency characteristics, respectively, FIGS. 9 and 10 diagrammatically illustrate a parallel circuit formed of the series resonance circuits in FIG. 7 and the impedance-frequency characteristic of the parallel circuit, FIGS. 11 and 12 diagrammatically illustrate a parallel circuit formed of L-C-R series resonance circuit and its impedance-frequency characteristic, FIG. 13 is a circuit diagram illustrating an embodiment of the principle of the sound effect amplifier according to the present invention, and FIG. 14 is a circuit diagram of a practical embodiment of the inventive sound effect amplifier which is applied to a stereophonic reproducing apparatus.

Before a description is made with respect to a preferred embodiment of the present invention, a description will first be made hereunder of a prior art circuit arrangement. FIG. 1 illustrates the circuit arrangement of an example of a conventional sound effect amplifier of the kind that utilizes a frequency band divisional amplification-attenuation device which operates to divide an input signal into respective frequency bands and to separately amplify or attenuate each of the divided frequency bands by use of a plurality of L-C series resonance circuits each consisting of an inductance (L) element and a capacitance (C) element and having its resonance frequency different from those of the others. In the conventional sound effect amplifier, large amount of negative feedback is applied to each of circuits of transistors 10, 11 and 12. Between negative feedback circuits and grounds, there are disposed, in parallel relation, series resonance circuits each comprising one of combinations of an inductor 13 and a capacitor 14, an inductor 15 and a capactior 16, . . . and an inductor 21 and a capacitor 22 and having particular resonance frequency which is different from those of other resonance circuits. Tapped variable resistors 23 through 27 are grounded at their intermediate points. The series resonance circuits have respectively connected thereto contact elements 28 through 32 which are in turn connected to the variable resistors, respectively for changing-over operation. An input signal supplied from an input terminal 33 is divided into respective frequency bands in accordance with the respective series resonance circuits. The frequency bands are amplified or attenuated with respect to their gains and are then delivered from an output terminal 34. Each of the L-C series resonance circuits has extremely lowered impedance at its resonance frequency thereof and, therefore, if the series resonance circuit is disposed between an input circuit of a transistor and a ground, a reduced negative feedback signal is obtainable resulting in an increased gain of the signal of the corresponding frequency band, whereas, if the series resonance circuit is disposed between an output circuit of the transistor and the ground, a resultant output signal is grounded at a lowered impedance resulting in a reduced gain of the signal of the freqeuncy band.

In the circuit of the conventional sound effect amplifier above specified, if respective resonance circuits are operated simultaneously, parallel resonance circuits are formed at respective intermediaries of the resonance frequencies of each adjacent pair of the series resonance circuits, which will produce mutual interference resulting in a deteriorated frequency characteristic. In order to prevent such mutual interference, therefore, the conventional circuit arrangement is required to employ a plurality of transistors (three transistors are used in the circuit of the above example) for forming buffer amplifiers. An increase in number of transistors to be used gives rise to drawbacks such as reduction in distortion factor and increase in cost of resultant device.

FIG. 2 shows an example of improvements in which a single transistor is used as substitute for the three transistors utilized in the above-mentioned conventional sound effect amplifier. In the circuit arrangement of this example, varaible resistors 40 to 44 have their intermediate points grounded and their opposite ends connected to an emitter circuit of a single transistor 45 and to a collector circuit thereof, respectively. Series resonance circuits having their respective resonance frequencies and each comprising a combination of an inductor 46 and a capacitor 47 . . . , or a combination of an inductor 54 and a capacitor 55 are connected at their one ends to sliders 56 to 60 of the variable resistors 40 to 44 and, at their other ends, to the grounds. An input signal fed from an input terminal 61 is divided into respective frequency bands corresponding to the series resonance circuits and is delivered as an output signal from an output terminal 62 after the respective frequency bands are subjected to amplification or attenuation with respect to their gains. The respective resonance circuits of the circuit arrangement of the instant example have amplification and attenuation characteristics as shown in FIG. 3 (this figure shows such characteristics of only three of the resonance circuits) and, when the resonance circuits are operated at the same time, the circuit arrangement as a whole is to have a general characteristic as shown by broken curves in FIG. 4. It will be apparent from FIG. 4 that the general characteristic is disadvantageous in that the broken curves representing it include valleys at frequencies positioned between each adjacent pair of tops of frequency characteristic curves of respective frequency bands.

In general, a series resonance circuit comprising an inductor $L_1$ and a capacitor $C_2$ as shown in FIG. 5 has an impedance characteristic as shown in FIG. 6, which has an inductance characteristic in the frequency range higher than the resonance frequency $F_1$ of the circuit and has a capacitance characteristic in the frequency range lower than the resonance frequency $F_1$. Similarly, two series resonance circuits each comprising a pair of an inductor $L_1$ and a capacitor $C_1$ and a pair of an inductor $L_2$ and a capacitor $C_2$ as shown in FIG. 7 have respective impedance characteristics as shown in FIG. 8 and have their respective resonance freqeuncies $F_1$ and $F_2$ ($F_1<F_2$). A resonance circuit formed by parallel-connecting the two series resonance circuits shown in FIG. 9 has its impedance characteristic, as shown in FIG. 10, having two valleys at the frequencies $F_1$ and $F_2$ and top at a frequency $F_3$, which indicates an occurrence of parallel resonance phenomenon. The frequency $F_3$ corresponding to the top of the curve depends on the inductance of the inductor $L_1$ and on the capacitance of the capacitor $C_2$.

A resonance circuit shown in FIG. 11 and formed by connecting damping resistors $R_1$ and $R_2$ in the respective series resonance circuits connected in parallel as shown in FIG. 9 has its impedance characteristic as shown in FIG. 12, by virtue of the two damping resistors $R_1$ and $R_2$ acting in the parallel resonance circuits of the inductor $L_1$ and the capacitor $C_2$. Namely, while each of the series resonance circuits has its reduced quality factor Q since a resistor acts as a damping resistance in each series resonance circuit, the parallel resonance circuit formed of the inductor $L_1$ and the capacitor $C_2$ has its quality factor Q which is more reduced than that of the series resonance circuit because two resistors $R_1$ and $R_2$ act as Q-dampers in the parallel circuit. Thus, the parallel resonance circuit as a whole has a general impedance characteristic represented by a curve which is relatively plane as illustrated in FIG. 12 and does not include any sharp valley and top as appearing in the curve in FIG. 10.

FIG. 13 illustrates a circuit arrangement of an embodiment of the present invention which is based on the above-described principle and is a further improvement in the circuit arrangement in FIG. 2. In FIG. 13, the elements identical with those in FIG. 2 are represented by the same reference numerals as used in FIG. 2 and description therefore is omitted. Resistors 70 through 74 are connected in series to respective series resonance circuits formed by respective elements 46 through 55 and acts as damping resistors therebetween. Thus, the parallel circuits formed of series resonance circuits comprising the elements 46 through 55 and the resistors 70 through 74 have, as a whole, a general impedance characteristic which is relatively planar as shown, for example, in FIG. 12. It is, therefore, apparent that, with the circuit arrangement of this invention, use of only a single transistor 45 enables to obtain an impedance frequency characteristic curve which is substantially similar to that obtainable from the use of a plurality of buffer amplifiers. Incidentally, while use of inductors having large direct current resistance rather than use of damping resistors provides, in case of lower frequency range, advantages substantially similar to those described in the above, it is convenient in practical mass production, in case of relatively higher frequency range, to employ ready-made inductors and connect them with resistors in series.

FIG. 14 illustrates an embodiment of specific circuit arrangement of the sound effect amplifier which is applied to a stereophonic reproducing apparatus. Left and right input signals fed from respective input terminals 80 and 81 for the left and right channels are passed through capacitors 82 and 83 and then are supplied to the bases of transistors 84 and 85, respectively. The left and right channel systems both have identical circuit arrangements and operations and, therefore, a description will be made only with respect to the left channel system illustrated above an earth line 86. Resistors 87 and 88 are bias resistors for causing the transistor 84 to operate at A-class. A capacitor 89 is for preventing an abnormal oscillation and is connected between the collector and the base of the transistor 84. A resistor 90 forms a collector resistance and a resistor 91 is an emitter resistance for always imparting negative feedback to the transistor. Variable resistors 92 through 96 have their intermediate terminals 97 through 101 all connected to the earth line 86. The variable resistors also have their terminals 102 through 106 all connected, through a capacitor 107, to the emitter of the transistor 84 and have the other terminals 108 through 112 connected, through a capacitor 113, to the collector of the transistor. Sliders 114 through 118 are positioned at intermediate points of the variable resistors 92 through 96, respectively, in normal operative state. To the respective sliders 114 through 118, are connected first to fifth series resonance circuits each consisting of a combination of an inductor 119 and a capacitor 120, . . ., and a combination of an inductor 127 and a capacitor 128. The first to fifth series resonance circuits have their respective resonance frequencies different one from the others and divide the input signal into five frequency bands. Resistors 129 through 132 are series-connected to the second to fifth series resonance circuits and serve as damping resistors, respectively. No resistor is connected to the first series resonance circuit and a direct current resistance component of an inductor 119 acts as a substantial damping resistance. Incidentally, the right channel system has the elements all corresponding to those in the above-described elements of the left channel system.

An example is given hereunder with respect to the value of each of the circuit element:

Capacitors 82 and 83—0.68 $\mu$f.
Capacitors 89 and 135—56 Pf.
Capacitors 107 and 143—5 $\mu$f.
Capacitors 113 and 114—33 $\mu$f.
Capacitors 120 and 146—3.3 $\mu$f.
Capacitors 122 and 148—0.68 $\mu$f.
Capacitors 124 and 150—0.22 $\mu$f.
Capacitors 126 and 152—0.047 $\mu$f.
Capacitors 128 and 154—0.01 $\mu$f.
Resistors 87 and 133—100K ohm
Resistors 88 and 134—47K ohm
Resistors 90 and 136—3.3K ohm
Resistors 91 and 137—4.7K ohm
Resistors 92–96 and 138–142—50K ohm (volume unit)
Resistors 129 and 155—220 ohm
Resistors 130 and 156—560 ohm
Resistors 131 and 157—680 ohm
Resistors 132 and 158—680 ohm
Inductors 119 and 145—1.4 henries
Inductors 121 and 147—0.6 henry
Inductors 123 and 149—100 mh.
Inductors 125 and 151—22 mh.
Inductors 127 and 153—10 mh.

The inductors 119 (145) through 127 (153) have 750 ohm, 450 ohm, 140 ohm, 30 ohm, 20 ohm, respectively, and, therefore, resistors $R_1$–$R_5$ of the first to fifth series resonance circuits including their damping resistors, are as follows:

$R_1$=700 ohm, $R_2$=670 ohm, $R_3$=700 ohm, $R_4$=710 ohm, $R_5$=700 ohm

Also, the first to fifth series resonance circuits have their respective resonance frequencies $f_1$–$f_5$ as follows:

$f_1$=60 Hz., $f_2$=250 Hz., $f_3$=1 kHz., $f_4$=5 kHz., $f_5$=15 kHz.

In case it is desired to increase a gain of frequency band whose central frequency is $f_4$, the slider 117 connected to the fourth series resonance circuit is shifted toward the terminal 105. The fourth series resonance circuit consisting of the inductor 125 and a capacitor 126 has an extremely lowered impedance at about the central frequency $F_4$ and, thus, when the fourth series resonance circuit including the emitter resistor 131 is connected to the resistor 91, the central frequency $F_4$ becomes to have lowered impedance which serves to reduce the negative feedback to the transistor 84 resulting in increase in the gain at the particular frequency band.

To the contrary, if it is required to reduce the gain of the frequency band whose central frequency is $f_4$, the slider 117 is moved toward the terminal 111. This serves to connect the collector resistor 90 with the fourth series resonance circuit which has a lowered impedance at the central frequency $f_4$ and, therefore, the output signal is to have its reduced gain.

Furthermore, even in an instance wherein it is desired to amplify or attenuate the gains of more than two frequency bands, for example, whose central frequencies are $f_4$ and $f_5$, respectively, there is obtained, as described above, an impedance characteristic which is represented by a relatively plane curve such as in FIG. 12 because of the fact that the resistors 131 and 132 are connected to the fourth and fifth series resonance circuits and the resistors act as damping resistances together with the direct current resistance components of the inductors The right and left channel signals of which the gains are increased or attenuated in each responsive frequency band are derived from the right and left terminals 159, 160, respectively, as the output signals. A variable resistor 161 is a stereo-balancer which is used to balance the volume of the right and left channels.

The variable range of the gain obtainable from the circuit arrangement of the instant embodiment is substantially represented by the equation, $$20 \log \frac{R_0+R}{R} \text{ (db)}$$

wherein $R_0$ represents impedance of the emitter circuit when no series resonance circuit is connected thereto, and R represents damping resistance including the resistance components of the inductors.

Sound variations with respect to respective resonance frequencies in the circuit of the instant embodiment and the example of the use thereof are as follows:

60 Hz.—effective to amplify and/or attenuate only the low-pitched sounds as of drum, contrabass, etc., without influencing semi-low-pitched sounds,
250 Hz.—effective to remove heavy sounds due to resonance of room structure,
1 kHz.—effective to enliven and soften singer's voice and to shift quasi sound source forwardly and backwardly,
5 kHz.—effective to clear up and soften sounds of stringed and percussion instruments, and
15 kHz.—effective to amplify and/or attenuate delicate sound as of cymbals etc.

It is to be understood that the present invention is not limited to the above described and illustrated embodiments, but may have various modifications without departing from the scope and spirit of the invention as defined in the appended claims.

What is claimed is:

1. A sound effect amplifier comprising a transistor, an output circuit connected to the collector of the transistor, a negative feedback circuit of which opposite ends thereof are respectively connected to the emitter of the transistor and to ground, a plurality of series resonance circuits each consisting of an inductor, a capacitor and a resistor, one terminal of each of said resonance circuits connected to ground, said series resonance circuits having resonance frequencies different from that of the others, means for selectively and independently connecting the other terminal of each of said resonance circuits to either of the output circuit and the negative feedback circuit through a corresponding one of adjustable resistors whereby an input signal is divided into respective frequency bands which are separately amplified or attenuated and then are delivered as an output signal, each resistance value of said resistors in the series resonance circuits being selected so as to substantially damp parallel resonance phenomena occurring between each adjacent pair of said series resonance circuits.

2. A sound effect amplifier comprising a transistor, an output circuit connected to the collector of the transistor, a negative feedback circuit of which opposite ends thereof are respectively connected to the emitter electrode of the transistor and to ground, a plurality of variable resistors disposed in parallel relation to one another each of which has opposite ends connected to the output circuit and to the negative feedback circuit and has a slider and an intermediate terminal connected to ground, series resonance circuits each consisting of an inductor, a capacitor and a resistance and connected between a corresponding one of said sliders of the variable resistors and ground, said resonance circuits having their resonance frequencies different one from the others, means for independently adjusting the position of each slider on the corresponding variable resistor whereby an input signal is divided into respective frequency bands which are separately amplified or attenuated depending on the distance from the intermediate terminals on respective variable resistors to the corresponding sliders toward either of the opposite ends of said variable resistors and then are delivered as an output signal, each said resistance in the series resonance circuits being selected so as to substantially damp parallel resonance phenomena occurring between each adjacent pair of said series resonance circuits.

3. A sound effect amplifier as defined in claim 2 coupled to each of right and left channel systems of a stereophonic reproducing apparatus.

4. A sound effect amplifier as defined in claim 2 wherein at least one of said resistance in the series resonance circuits consists of by a direct current resistance component of the inductor in the corresponding series resonance circuit.

5. A sound effect amplifier as defined in claim 2 in which said plurality of series resonance circuits respectively have different resonance frequencies ranging from 60 Hz. to 15 kHz., and in which said amplifier is operable to separately or simultaneously amplify or attenuate the gains of respective frequency bands, thereby providing sound effect for respective frequency bands.

6. A sound effect amplifier as defined in claim 5, wherein the said resistance of the series resonance circuit having the lowest resonance frequency consists of the direct current resistance component of the corresponding inductor.

7. A sound effect amplifier as defined in claim 2 in which an obtainable gain is variable within a range which is substantially represented by an equation, $$20 \log \frac{R_0+R}{R} \text{ (db)}$$

wherein R denotes the resistance value of the said resistance in one of the series resonance circuits and $R_0$ denotes an impedance of said negative feedback circuit when the latter does not have any series resonance circuit connected thereto.

References Cited

UNITED STATES PATENTS

| | | | |
|---|---|---|---|
| 1,559,868 | 11/1925 | Hartley | 330—103 |
| 3,356,962 | 12/1967 | Morgan | 330—103 |

JOHN KOMINSKI, Primary Examiner

U.S. Cl. X.R.

330—31, 94, 103